(12) United States Patent
Lu et al.

(10) Patent No.: US 9,105,466 B2
(45) Date of Patent: Aug. 11, 2015

(54) INTEGRATED CIRCUIT

(71) Applicant: TAIWAN SEMICONDUCTOR MANUFACTURING COMPANY, LTD., Hsinchu (TW)

(72) Inventors: Lee-Chung Lu, Taipei (TW); Li-Chun Tien, Tainan (TW); Hui-Zhong Zhuang, Kaohsiung (TW); Mei-Hui Huang, Cupertino, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 9 days.

(21) Appl. No.: 14/084,823

(22) Filed: Nov. 20, 2013

(65) Prior Publication Data
US 2014/0077270 A1    Mar. 20, 2014

Related U.S. Application Data

(62) Division of application No. 13/267,310, filed on Oct. 6, 2011, now Pat. No. 8,607,172.

(51) Int. Cl.
*G06F 17/50*    (2006.01)
*H01L 27/02*    (2006.01)
*H01L 27/118*    (2006.01)

(52) U.S. Cl.
CPC ........ *H01L 27/0207* (2013.01); *G06F 17/5077* (2013.01); *H01L 27/11807* (2013.01); *G06F 17/5068* (2013.01); *H01L 2027/11875* (2013.01); *H01L 2027/11885* (2013.01)

(58) Field of Classification Search
CPC .................. H01L 27/0207; G06F 17/5068
USPC ........... 716/110, 119–120, 126, 130, 133; 257/202, 204, 206–207, 211, 288, 369, 257/379, 786
See application file for complete search history.

(56) References Cited

U.S. PATENT DOCUMENTS

| | | | |
|---|---|---|---|
| 2005/0044522 A1* | 2/2005 | Maeda ........................... | 716/18 |
| 2007/0228419 A1 | 10/2007 | Komaki | |
| 2009/0083686 A1 | 3/2009 | Itaka et al. | |
| 2010/0059794 A1 | 3/2010 | Shimizu et al. | |

* cited by examiner

*Primary Examiner* — Paul Dinh
(74) *Attorney, Agent, or Firm* — Lowe Hauptman & Ham, LLP

(57) ABSTRACT

An integrated circuit includes a first standard cell over a substrate, a power rail, and a first connection plug. The first standard cell includes an active area, at least one gate electrode overlapping the active area of the first standard cell, and at least one metallic line structure overlapping the active area of the first standard cell. The at least one metallic line structure is substantially parallel to the gate electrode. The power rail is substantially orthogonal to the at least one metallic line structure of the first standard cell. The power rail overlaps the at least one metallic line structure of the first standard cell, and the power rail has a flat edge extending through the first standard cell. The first connection plug is at a region where the power rail overlaps the at least one metallic line structure of the first standard cell.

21 Claims, 9 Drawing Sheets

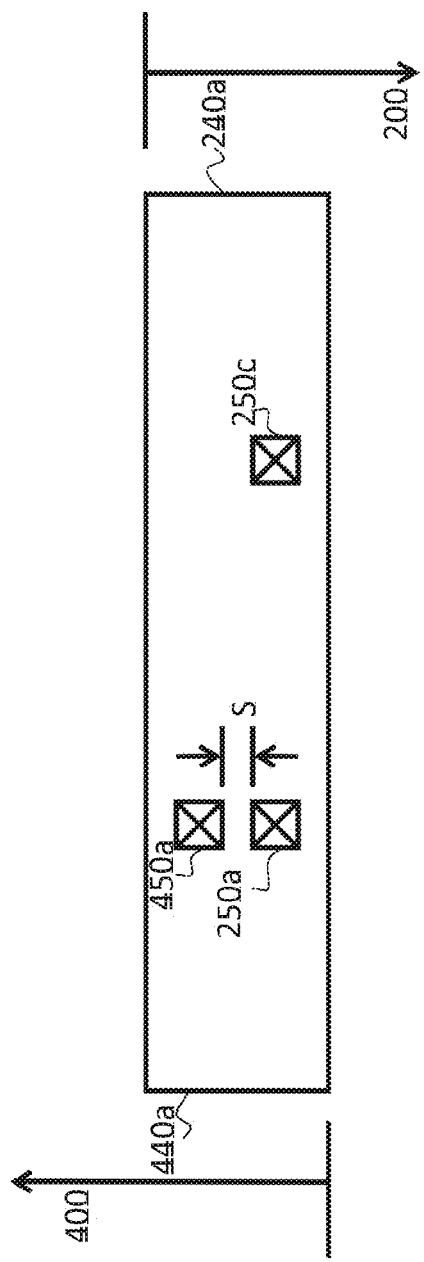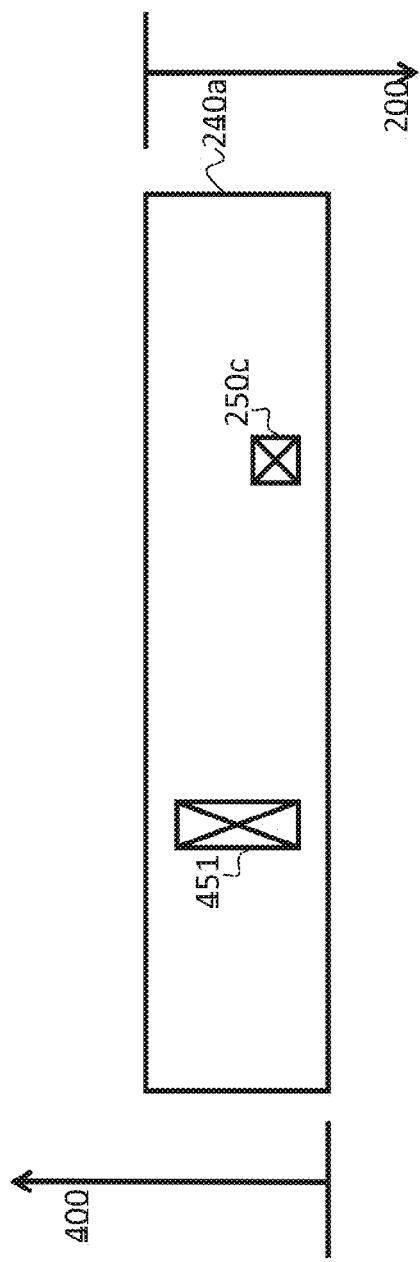

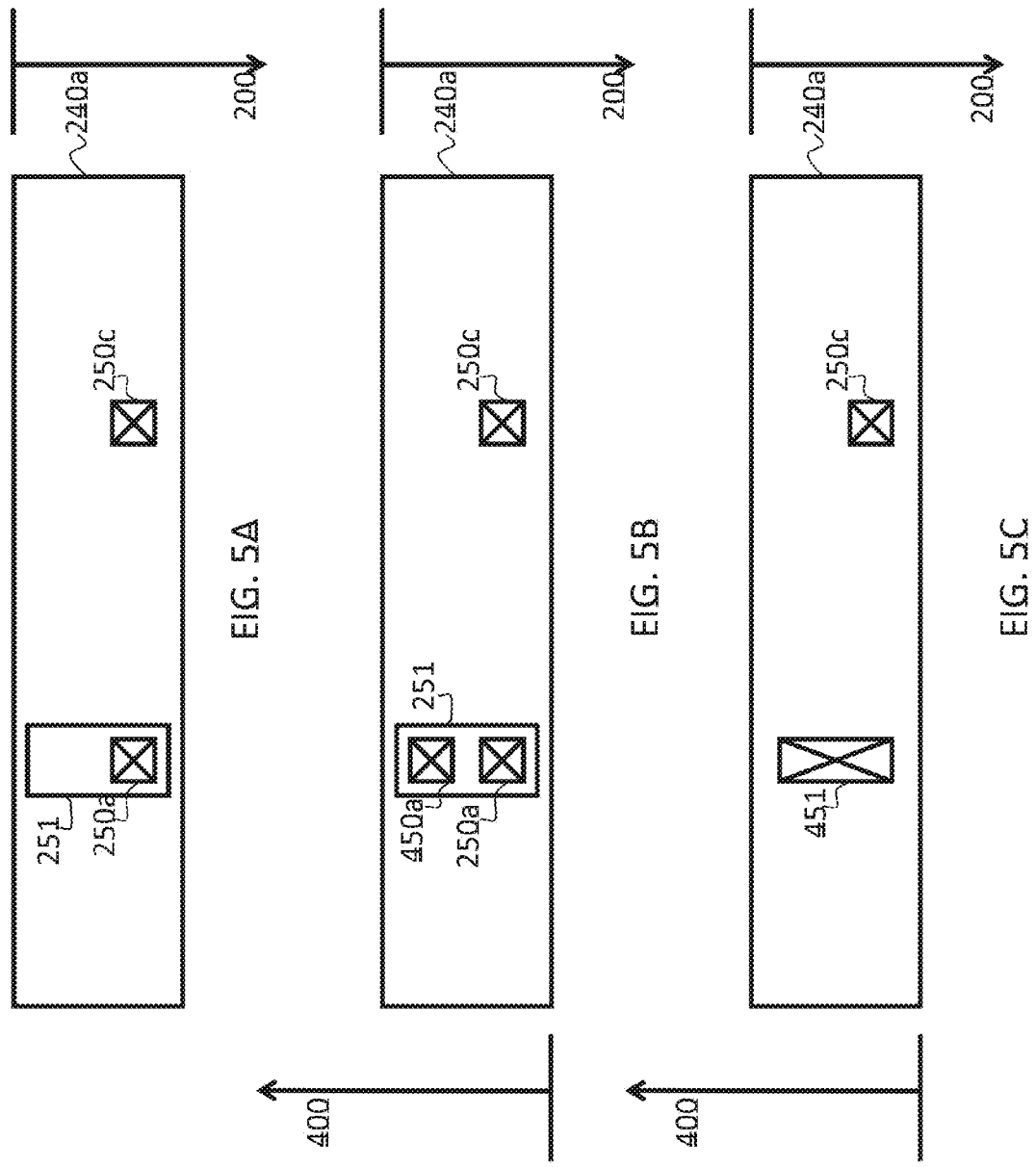

INTEGRATED CIRCUIT

PRIORITY CLAIM

The present application is a divisional of U.S. application Ser. No. 13/267,310, filed Oct. 6, 2011, which is incorporated herein by reference in its entirety.

TECHNICAL FIELD

The present disclosure relates generally to the field of semiconductor devices and, more particularly, to integrated circuits and methods of designing the same.

BACKGROUND

System level designers who determine a need for a newly defined integrated circuit, for example to integrate a variety of functions into one chip, often use an application specific integrated circuit (ASIC) or system on a chip (SOC) cell based design. In this approach, a library of known functions is provided, and after the functional design of the device is specified by choosing and connecting these standard functions, and proper operation of the resulting circuit is verified using electronic design automation (EDA) tools, the library elements are mapped on to predefined layout cells, which contain prefigured elements such as transistors. The cells are chosen with the particular semiconductor process features and parameters in mind and create a process parameterized physical representation of the design. The design flow continues from that point by performing placement and routing of the local and global connections needed to form the completed design using the standard cells. Eventually, after design rule checks, design rule verification, timing analysis, critical path analysis, static and dynamic power analysis, and final modifications to the design, a "tape out" step is formed to produce photomask generation data. This photomask generation (PG) data is then used to create the optical masks used to fabricate the semiconductor device in a photolithographic process at a wafer fabrication facility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

FIGS. 4A-4B are schematic drawings showing an exemplary method of replacing or merging neighboring connection plugs.

FIGS. 5A-5C are schematic drawings showing another exemplary method of replacing or merging neighboring connection plugs.

DETAILED DESCRIPTION

Figure 1:
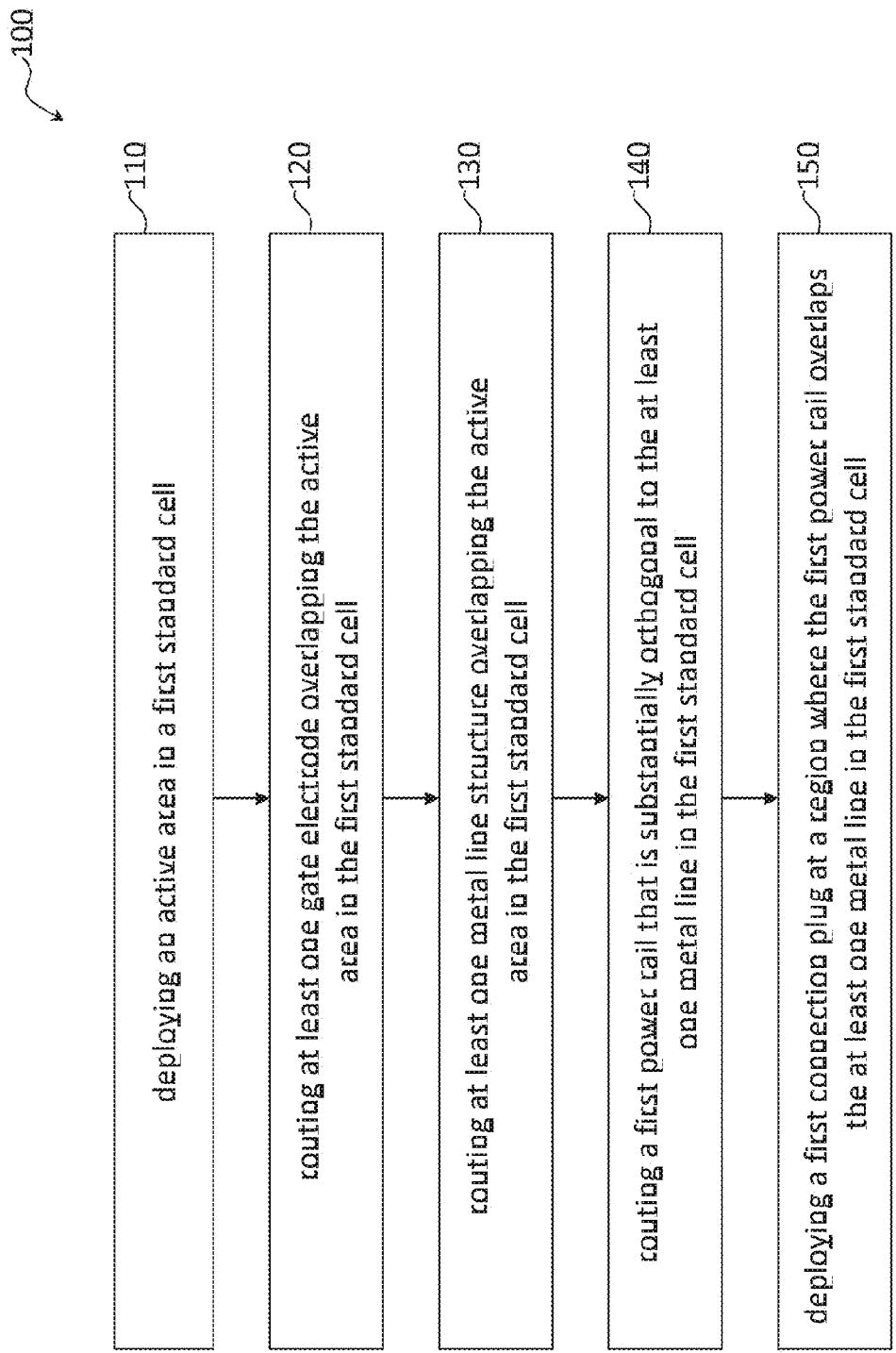
FIG. 1 is a flowchart of an exemplary method of designing an integrated circuit.

As semiconductor processes advance, device sizes continue to decrease. As the transistor sizes shrink commensurate with the advances in the technology nodes, the device characteristics and performance become dominated by physical layout effects. The devices also exhibit wide performance differences due to semiconductor process variations. Robust designs are desired to achieve these effects.

As the technology node shrinks, areas of standard cells become smaller. Layouts in the standard cells become complicate and difficult. During the cell level design, a metal layer M1 is usually routed for electrically connecting various transistors in a standard cell. As the cell area shrinks, the metal layer M1 may not fully electrically connect the transistors. In such a situation, a metal layer M2 is used to electrically connect nodes that are not connected by the metal layer M1.

During a place and route (P&R) process, the designed standard cells are coupled together by multiple levels of interconnect. If the metal layer M2 in the cell level has a substantive area cost, the P&R process may need an additional level of interconnect to couple the various standard cells and avoid conflicting the routing of the metal layer M2 in the cell level. The extra metal layer in the interconnect increases the manufacturing cost, process cycle time, etc.

It is understood that the following descriptions provide many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc., as well as derivatives thereof (e.g., "horizontally," "downwardly," "upwardly," etc.) are used for ease of the present disclosure of one feature's relationship to another feature. The spatially relative terms are intended to cover different orientations of the device including the features.

FIG. 1 is a flowchart of an exemplary method of designing an integrated circuit. It is understood that FIG. 1 has been simplified for a better understanding of the concepts of the present disclosure. Accordingly, it should be noted that additional processes may be provided before, during, and/or after the method 100 of FIG. 1, and that some other processes may only be briefly described herein.

Referring to FIG. 1, a method 100 of designing an integrated circuit can include deploying an active area in a first standard cell (block 110). At least one gate electrode is routed, overlapping the active area in the first standard cell (block 120). At least one metallic line structure is routed, overlapping the active area in the first standard cell (block 130). A first power rail is routed and is substantially orthogonal to the at least one metallic line structure in the first standard cell (block 140). A first connection plug is deployed at a region where the first power rail overlaps the at least one metallic line structure in the first standard cell (block 150).

In some embodiments, the integrated circuit includes various standard cells and/or functional circuits that are separately designed and then integrated. In some embodiments, the integrated circuit can be a digital circuit, an analog circuit, a mixed-signal circuit, a static random access memory (SRAM) circuit, an embedded SRAM circuit, a dynamic random access memory (DRAM) circuit, an embedded DRAM circuit, a non-volatile memory circuit, e.g., FLASH, EPROM, $E^2$PROME, a field-programmable gate circuit, a microprocessor, a telecommunication chip, a graphic chip, and/or any combinations thereof. In some embodiments, the integrated circuit includes at least one standard cell. A standard cell can include at least one transistor and at least one interconnect structure that may provide a Boolean logic function, a storage function, and/or other functions. In some embodiments, the standard cell can be an AND gate, a NAND gate, an OR gate, a NOR gate, a XOR gate, a XNOR gate, any other logic gate, an inverter, a flip-flop, a latch, or any other standard cell.

Figure 2A:
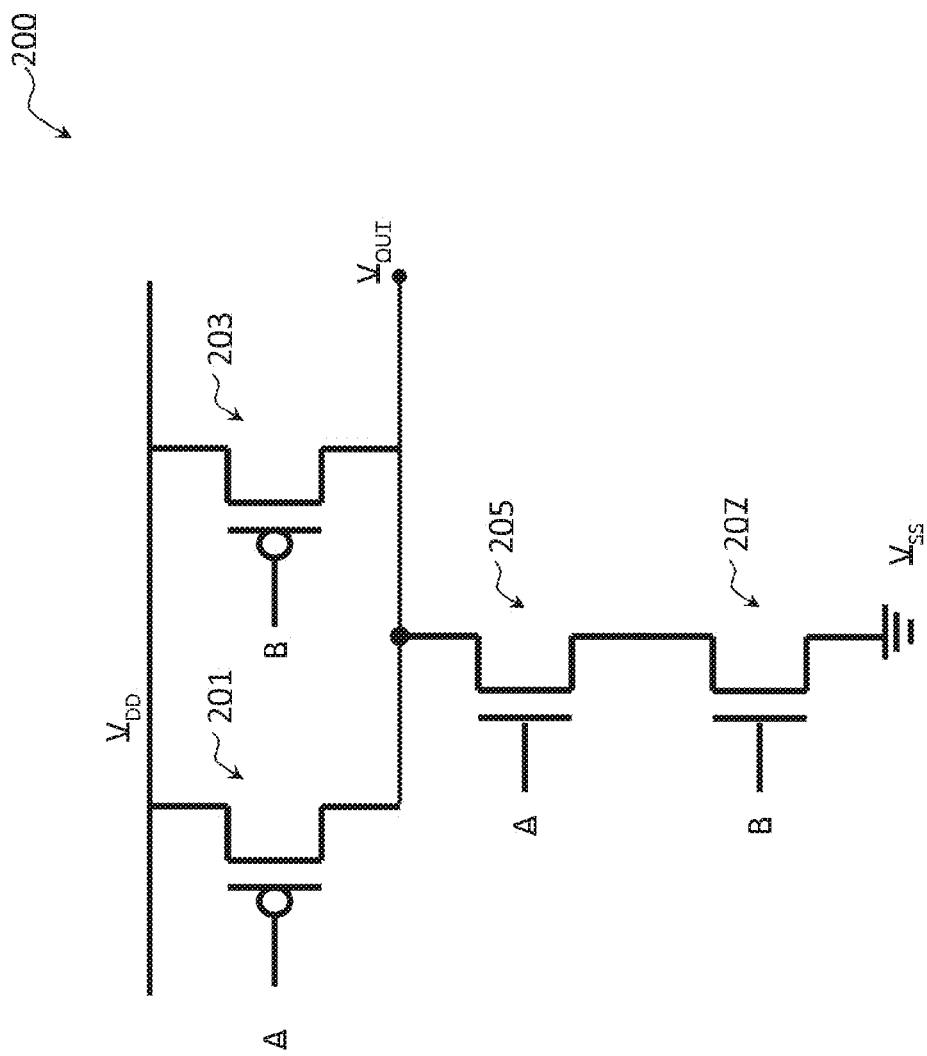
FIG. 2A is a schematic drawing of a NAND gate standard cell.

For example, FIG. 2A is a schematic drawing of a NAND gate. In FIG. 2A, a NAND gate 200 includes P-type transistors 201 and 203 and N-type transistors 205 and 207. The P-type transistors 201 and 203 are electrically coupled in a parallel fashion. The N-type transistors 205 and 207 are electrically coupled in series. An output node $V_{OUT}$ is between the parallel P-type transistors 201 and 203 and the series N-type transistors 205 and 207. Gates of the P-type transistor 201 and the N-type transistor 205 are configured to receive a signal A. Gates of the P-type transistor 203 and the N-type transistor 207 are configured to receive a signal B. By controlling the signals A and B to the transistors, an output of an NAND logic operation is generated on the output node $V_{OUT}$.

Figure 2B:
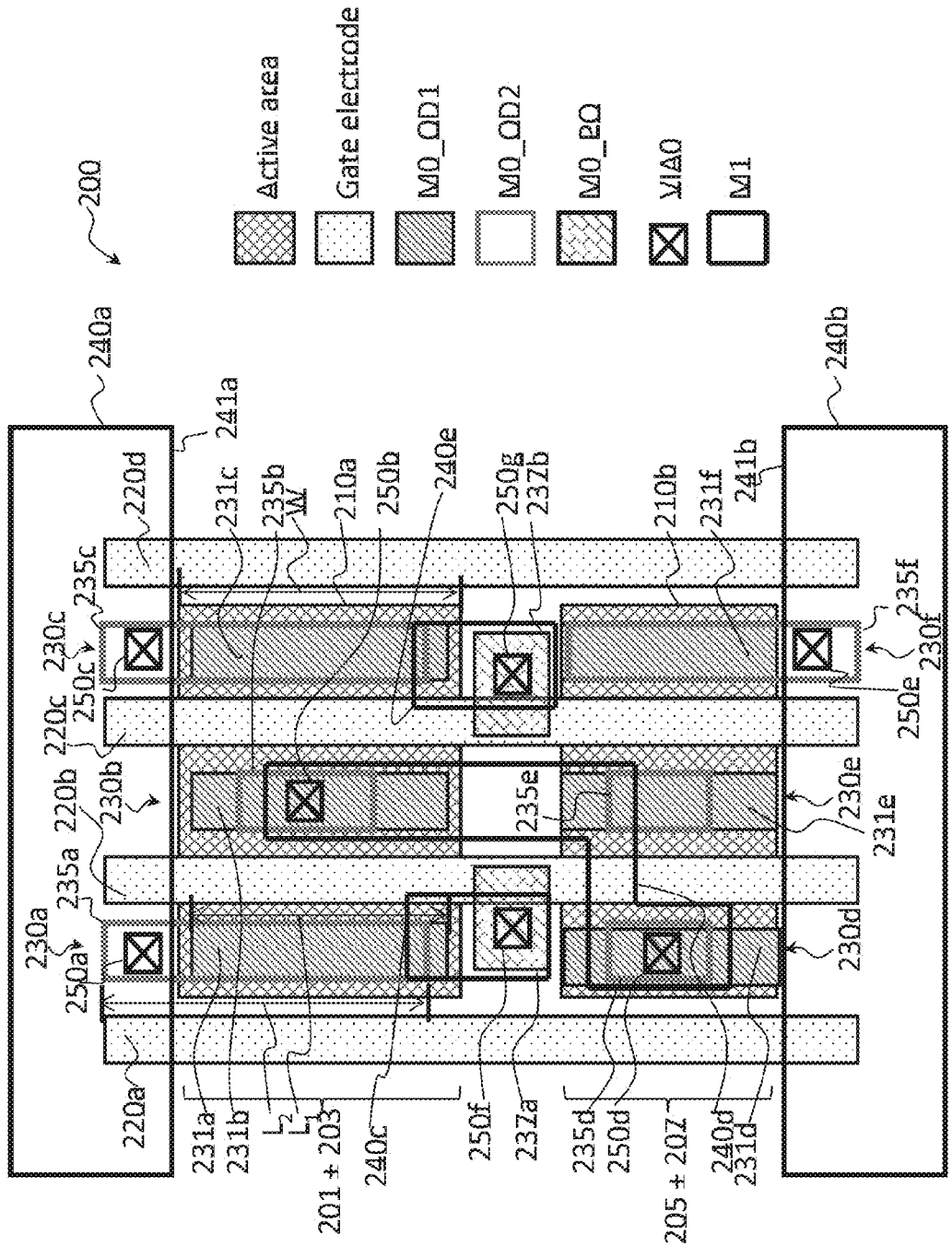
FIG. 2B is a schematic drawing illustrating exemplary layout layers of a NAND gate standard cell.

FIG. 2B is a schematic drawing including exemplary layout layers of an NAND gate. It is noted that the exemplary drawing shown in FIG. 2B merely depicts overlaps of an active area, a gate electrode layer, a plug layer and various metallic layers. It is noted that the routings of the various layers of the NAND gate 200 shown in FIG. 2B are merely exemplary. One of ordinary skill in the art can modify the routings and/or configurations of the layers to achieve various standard cells.

Referring to FIGS. 1 and 2B, block 110 includes deploying an active area in a first standard cell. For example, active areas 210a and 210b are deployed in the standard cell 200 as shown in FIG. 2B. The active areas 210a and 210b are designated for the P-type transistors 201 and 203 and the N-type transistors 205 and 207, respectively. Areas around the active areas 210a and 210b are referred to as field oxide regions where shallow trench isolation (STI) structures and/or a local oxidation of silicon (LOCOS) structures are formed.

Referring to FIGS. 1 and 2B, block 120 includes routing at least one gate electrode that overlaps the active area in the first standard cell. For example, gate electrodes 220a-220d are routed in a routing direction as shown in FIG. 2B. In some embodiments, the gate electrodes 220a and 220d are referred to as dummy gate electrodes. The gate electrode 220b is shared by the P-type transistor 201 and the N-type transistor 205. The gate electrode 220c is shared by the P-type transistor 203 and the N-type transistor 207. The gate electrodes 220b and 220c are routed cross over and partially overlap the active areas 210a and 210b.

Referring to FIGS. 1 and 2B, block 130 includes routing at least one metallic line structure that overlaps the active area in the first standard cell. For example, metallic line structures 230a-230f are routed in the standard cell 200 as shown in FIG. 2B. The metallic line structures 230a-230f are configured to function as portions of the source/drain (S/D) regions of the P-type transistors 201, 203 and the N-type transistors 205, 207. In some embodiments, the combined structures of the active areas 210a and 210b and the respective metallic line structures 230a-230f are referred to the S/D regions of the P-type transistors 201 and 203 and the N-type transistors 205 and 207.

In FIG. 2B, the metallic line structures 230a-230f are substantially parallel to the gate electrodes 220a-220d. The metallic line structures 230a-230c and 230d-230f are electrically coupled with the active areas 210a and 210b, respectively, for reducing S/D resistances of the P-type transistors 201 and 203 and the N-type transistors 205 and 207. It is noted that the metallic line structures 230a-230f are not configured to serve electrical connection of an interconnect structure that is deployed during a P&R process.

In some embodiments, the block 130 includes routing metallic lines 231a-231c 231c and 213d-231f overlapping the active areas 210a and 210b, respectively. The block 130 further includes routing metallic lines 235a-235f overlapping the respective metallic lines 231a-231f. In some embodiments, the metallic line 231a has a length $L_1$ which is substantially equal to or shorter than a width W of the active area 210a as shown in FIG. 2B. The metallic line 235a has a length $L_2$ which is substantially equal to or longer than the width W of the active area 210a.

Referring to FIG. 2B, the metallic lines 231a-231c and 231d-231f are electrically coupled with and abut the active areas 210a and 210b, respectively. The metallic lines 235a-235f are disposed over and abut the respective metallic lines 231a-231f. In some embodiments, the layers of the metallic lines 231a-231f and 235a-235f can be referred to as a M0_OD1 layer and a M0_OD2 layer, respectively. As noted, the metallic lines 231a-231f and 235a-235f are configured- to function as parts of the S/D regions of the P-type transistors 201 and 203 and the N-type transistors 205 and 207.

In some embodiments, metallic structures 237a and 237b are optionally disposed over and abut the gate electrodes 220b and 220c, respectively. For example, the metallic structure 237a is disposed over and abuts the gate electrode 220b, such that the heights of metallic structure 237a and the gate electrode 220b are substantially equal to the heights of the metallic lines 231a and 235a. In some embodiments, the metallic structure 237a is in the layer that is the same as the metallic line 235a. In other embodiments, the layer of the metallic structures 237a and 237b can be referred to as a M0_PO layer.

Referring to FIGS. and 2B, block 140 includes routing a first power rail that is substantially orthogonal to the at least one metallic line structure in the first standard cell. For example, power rails 240a and 240b are routed over and substantially orthogonal to the metallic line structures 230a-230c and 230d-230f, respectively, as shown in FIG. 2B. In some embodiments, the power rails 240a and 240b overlap and are substantially orthogonal to the metallic lines 235a, 235c and 235f, respectively. The power rails 240a and 240b are configured to provide supply voltages $V_{DD}$ and $V_{SS}$, respectively. The power rails 240a and 240b have respective flat edges 241a and 241b that are adjacent to the metallic lines 235a and 235f.

In some embodiments optionally including the metallic structures 237a and 237b, metallic lines 240c and 240e are routed over and overlap the metallic structures 237a and 237b, respectively. A metallic line 240d is routed over, overlaps, and continuously extends from the metallic line 235b to the metallic line 235d. The metallic lines 240c-240e and the power rails 240a-240b are formed in the same layer. It is noted that the routing of the metallic lines 240c-240e shown in FIG. 2B is merely exemplary. The scope of this application is not limited thereto.

Referring to FIGS. 1 and 2B, block 150 includes deploying a first connection plug at a region where the first power rail overlaps the at least one metallic line structure in the first standard cell. For example, connection plugs 250a, 250c and 250e are deployed at regions where the power rails 240a and 240b overlap the metallic lines 235a, 235c and 235f, respectively, as shown in FIG. 2B. In the NAND gate 200, the connection plugs 250a and 250c are disposed below the power rail 240a and over the metallic lines 250a and 250c, respectively, for electrical connection. The connection plug 250e is disposed below the power rail 240b and over the metallic line 235f for electrical connection.

Referring to FIG. 2B, connection plugs 250b and 250d are disposed over the respective metallic lines 235b and 235d and below the metallic line 240d for electrical connection. Connection plugs 250f and 250g are disposed over the metallic structures 237a and 237b and below the metallic lines 240c and 240e, respectively, for electrical connection. In some embodiments, the layer of the connection plugs 250a-250g can be referred to as a VIA0 layer.

As noted, the flat edges 241a and 241b of the power rails 240a and 240b have no extrusion and/or tooth-shaped configuration. Such a pattern, when transferred on a substrate, may be distorted due to rounding and/or shortening effects by a photolithographic process. As shown in FIG. 2B, the metallic lines 235a, 235c and 235f extend below and are electrically coupled with the respective power rails 240a and 240b through the respective connection plugs 250a, 250c and 250e. Without the extrusion and/or tooth-shaped configuration on edges 241a and 241b, the metallic lines 240c-240e have more room to be deployed between the flat edges 241a and 241b. The metallic lines 240c-240e can electrically connect nodes of the NAND gate 200 in the cell. Without using additional metal layers, the NAND gate 200 can be designed into a pre-defined area at the cell level.

Figure 3:
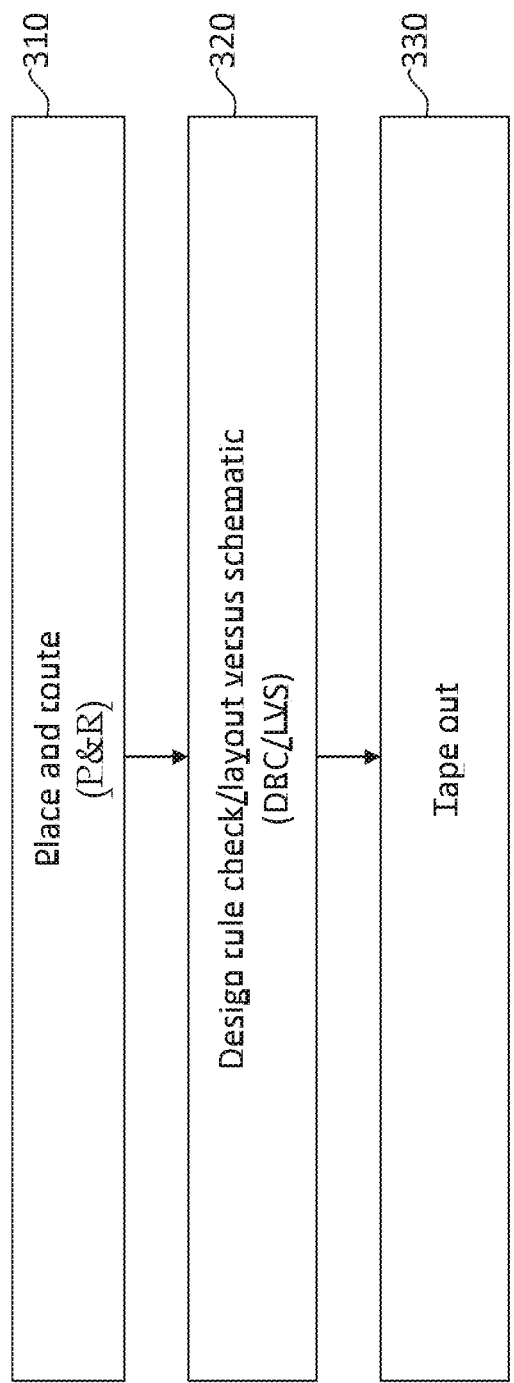
FIG. 3 is a flowchart of an exemplary method after the cell level design.

Following are descriptions regarding exemplary methods of replacing and/or merging two neighboring connection plugs of abutted standard cells that share the same power rail. Referring to FIG. 3, after the cell level design described above in conjunction with FIGS. 1 and 2A-2B, a place and route (P&R) process 310 is performed to integrate various standard cells and circuits. The P&R process 310 includes routing various metallic layers for connecting the various cells and circuits together. In some embodiments, the interconnection routing can be referred to as a "top layer connection." The top layer connection is different from the metallic lines 231a-231f, 235a-235f and 240a-240e that are routed in the cell level as described above in conjunction with FIG. 2B.

In some embodiments, the P&R process 310 includes abutting the standard cell 200, described above in conjunction with FIG. 2B, with another standard cell. For example, the standard cell 200 abuts a standard cell 400 as shown in FIG. 4A. FIG. 4A is a schematic drawing including a shared power rail and connection plugs of abutted standard cells. In FIG. 4A, at the cell level the standard cell 400 includes a power rail 440a and a connection plug 450a that overlaps the power rail 440a. As the power rails 240a and 440a are configured to provide the same supply voltage, e.g., $V_{DD}$, the power rails 240a and 440a overlap each other and are shared by the abutted standard cells 200 and 400.

Referring to FIG. 4A, after abutting the standard cells 200 and 400, the connection plugs 250a and 450a are adjacent to each other and separated from each other by a space S. After the P&R process 310, a design rule check/layout versus schematic (DRC/LVS) process 320 is performed as shown in FIG. 3. The DRC is performed to check if there is any design rule violation of the integrated circuit. The LVS is performed to check if the layout netlist of the integrated circuit matches the schematic netlist of the integrated circuit.

In some embodiments, the DRC process checks if the space S between the connection plugs 250a and 450a violates the design rule of the integrated circuit. For example, if the space S is smaller than a pre-determined dimension, the DRC process raises a flag for the DRC violation. As noted, the connection plugs 250a and 450a are electrically connected to the same power rail 240a. The DRC violation regarding the space S between the connection plugs 250a and 450a can be treated as a message. The message is processed to replace the connection plugs 250a and 450a with a larger connection plug 451 or merge the connection plugs 250a and 450a becoming the larger connection plug 451 as shown in FIG. 4B. As shown in FIG. 4B, in the top view the area of the connection plug 451 is larger than the sum of the areas of the connection plugs 250a and 450a. In some embodiments, after replacing or merging the connection plugs 250a and 450a, another DRC/LVS process may be optionally performed to clean real DRC violations and/or LVS mismatches.

Referring to FIG. 3, after generating the connection plug 451 a tape out process 330 converts the database file of the integrated circuit to a Graphic Database System (GDS) file (e.g., a GDSII file). The GDS file is then used to make various layers of masks for integrated circuit manufacturing. In some embodiments, the layout database can be stored as a format that can be processed by VIRTUOSO® Layout Editor, or VIRTUOSO® XL-Layout Editor, commercially available from Cadence Design Systems of San Jose, Calif. U.S.A., or LAKER™ commercially available from Springsoft Inc. of Taiwan.

It is noted that replacing or merging the connection plugs 250a and 450a can be performed in the tape out process 330, instead of the DRC/LVS process 320. For example, after checking the DRC violation regarding the space S between the connection plugs 250a and 450a, the database file including the DRC violation is forwarded to the tape out process 330. The tape out process 330 then replaces or merges the connection plugs 250a and 450a.

In some embodiments to replace or merge the connection plugs 250a and 450a, a dummy layer is provided in the cell level design. For example, a dummy slot 251 of the dummy layer that covers the connection plug 250a is deployed during the cell level design as shown in FIG. 5A. The dummy slot 251, from the top view, has an area that is larger than the connection plug 250a.

The P&R process 310 described above in conjunction with FIG. 3 then abuts the standard cells 200 and 400, such that the power rail 240a is shared by the standard cells 200 and 400 as shown in FIG. 5B. During the DRC/LVS process 320, it is determined if the connection plug 450a overlaps the dummy slot 251. In some embodiments, the overlap of the connection plug 450a and the dummy slot 251 means the connection plugs 450a is enclosed by the dummy slot 251. In other embodiments, the overlap of the connection plug 450a and the dummy slot 251 means at least three sides of the connection plug 450a is enclosed by the dummy slot 251. In still other embodiments, the overlap of the connection plug 450a and the dummy slot 251 means at least partial overlap between the connection plug 450a and the dummy slot 251.

In response to the overlap of the connection plug 450a and the dummy slot 251, the connection plugs 250a and 450a are replaced by or merged to generate the larger connection plug

451 as shown in FIG. 5C. As noted, replacing or merging the connection plugs 250a and 450a can be performed in the DRC/LVS process 320 or the tape out process 330 thereafter.

Figure 6A:
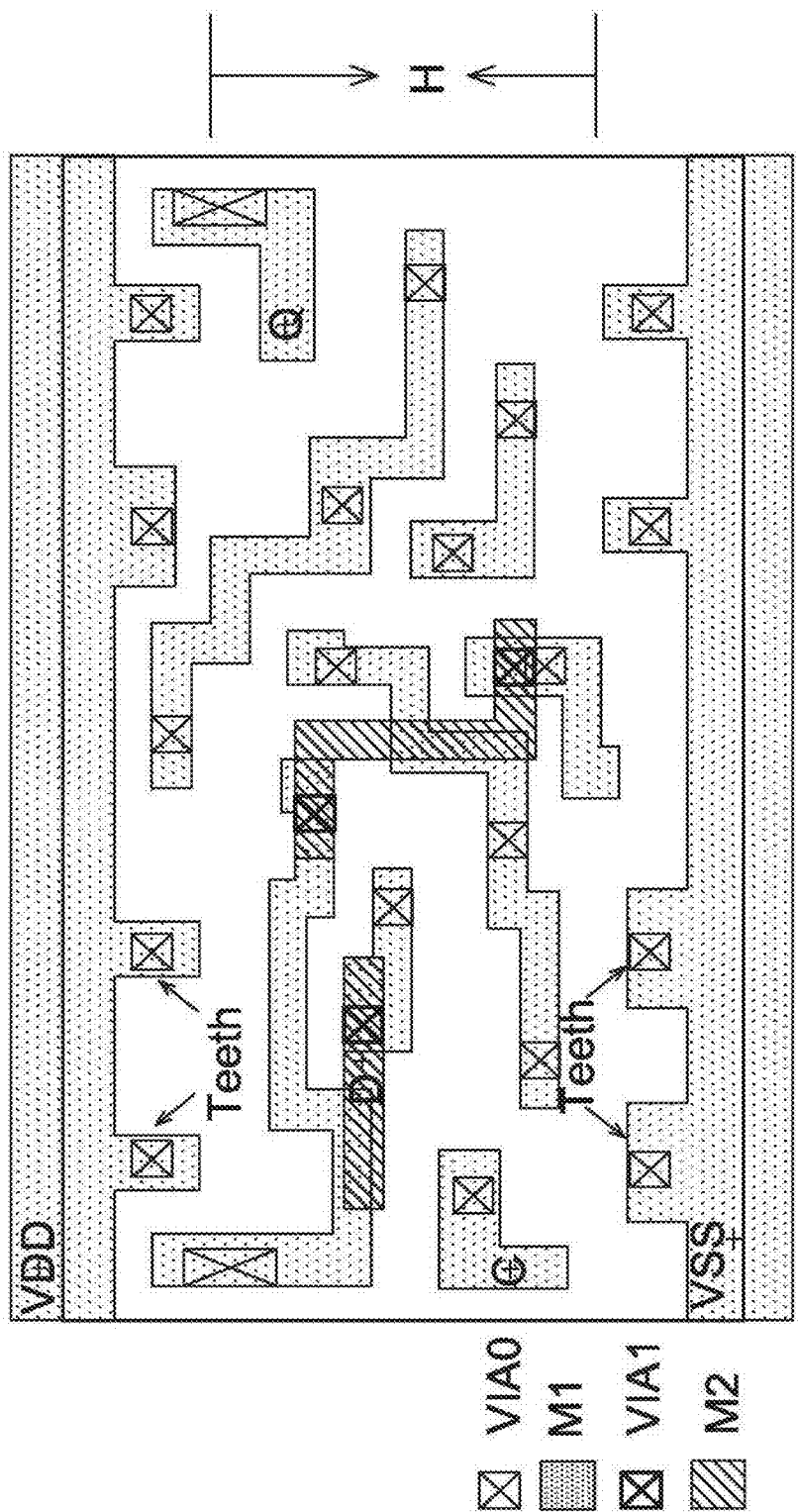
FIG. 6A is a layout of a known latch standard cell.

As described above in conjunction with FIG. 2B, without the extrusion and/or tooth-shaped configuration on the edges 241a and 241b, the NAND gate 200 can be designed into a pre-defined area at the cell level. For example, FIG. 6A is a schematic drawing of a known latch standard cell. FIG. 6A merely shows a connection plug layer and two metallic layers at the cell level. As shown in FIG. 6A, the tooth-shaped configuration on the edges of $V_{DD}$ and $V_{SS}$ power rails costs the height H between the power rails. The metallic layer M1 routing for electrical connections among devices, e.g., transistors, diodes, and/or other devices, with the latch standard cell may be restrained within the height H. To fully electrically connect the remaining nodes of the transistors at the cell level, additional connection plug layer VIA1 and metal layer M2 are used. Due to the use of the metallic layer M2, the space for a metallic routing of the top layer interconnection during the P&R process 310 described above in conjunction with FIG. 3 is reduced. Additional metallic layer(s) of the top layer interconnection may be required.

Figure 6B:
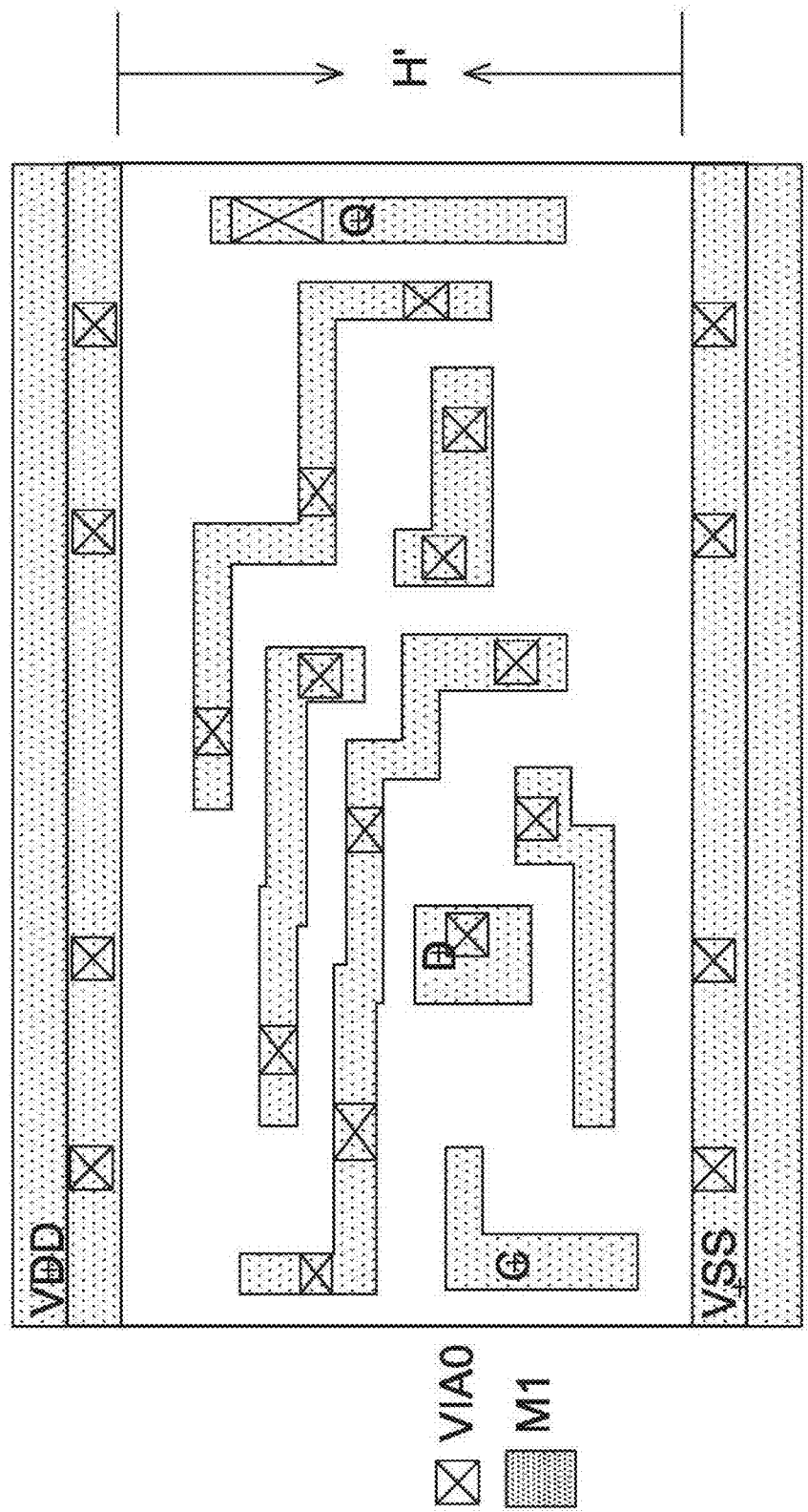
FIG. 6B is a layout of an exemplary latch standard cell of this application.

To the contrary, the $V_{DD}$ and $V_{SS}$ power rails of the latch standard cell shown in FIG. 6B does not have the tooth-shaped configuration as shown in FIG. 6A. Without the tooth-shaped configuration, the height H' between the $V_{DD}$ and $V_{SS}$ power rails can accommodate more routing of the metal layer M1 along the direction of the height H'. Due to the relaxation of the height H' of the latch standard cell, the metal layer M2 used in FIG. 6A is saved in the cell level design. The space and flexibility for a metallic routing of the top layer interconnection during the P&R process 310 is increased.

As noted, the database file including the patterns of FIGS. 2B, 4B, 5C and/or 6B can be converted by the tape out process 330 to form multiple layers of photomasks. Photomasks are used in any suitable semiconductor process to transfer the patterns on a substrate.

For example, the active areas 210a and 210b (shown in FIG. 2B) can be formed in a substrate. The active areas 210a and 210b can be separated by an isolation structure. In some embodiments, the substrate may include an elementary semiconductor material, a compound semiconductor material, an alloy semiconductor material, or any other suitable material or combinations thereof. The elementary semiconductor material can include silicon or germanium in crystal, polycrystalline, or an amorphous structure. The compound semiconductor material can include silicon carbide, gallium arsenide, gallium phosphide, indium phosphide, indium arsenide, and indium antimonide. The alloy semiconductor material can include SiGe, GaAsP, AlInAs, AlGaAs, GaInAs, GaInP, and GaInAsP. In one embodiment, the alloy semiconductor substrate may have a gradient SiGe feature in which the Si and Ge composition change from one ratio at one location to another ratio at another location. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epitaxial layer or a buried layer. In other examples, the compound semiconductor substrate may have a multilayer structure, or the substrate may include a multilayer compound semiconductor structure.

In some embodiments, an N-type well region and a P-type well region 109 can be formed in active areas 210a and 210b, respectively. The N-type well region can have dopants such as Arsenic (As), Phosphorus (P), other group V elements, or any combinations thereof. The P-type well region can have dopants such as Boron (B) and/or other group III elements.

The P-type transistors 201 and 203 can include source regions and drain regions. In some embodiments, the source regions and the drain regions include stress structures that are configured to provide a stress to channels of the P-type transistors 201 and 203. The stressed channel can modify a mobility of carriers therein so as to change electrical characteristics, e.g., electrical current, of the P-type transistors 201 and 203. In some embodiments, the stress structures in the drain and source regions can be referred to as raised sources and raised drains. In some embodiments, the stress structures each include a single SiGe or $Si_xGe_{1-x}$ layer, a multi-layer SiGe or $Si_xGe_{1-x}$ structure, an epitaxial structure, a compound material structure, other materials that can modify the carrier mobility of the P-type transistors 201 and 203, or any combinations thereof.

In some embodiments, the source and drain regions optionally include P-type lightly-doped drains (LDDs). The P-type LDDs each have a dopant type that is opposite to that of the N-type well region. In other embodiments, the source and drain regions each include a silicide region. The silicide regions can be made of at least one material such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, or any combinations thereof.

In some embodiments, the N-type transistors 205 and 207 each include a source region and a drain region. In some embodiments, the source region and the drain region optionally include N-type lightly-doped drains (LDDs). The N-type LDDs have a dopant type that is opposite to that of the P-type well region. In other embodiments, the source region and the drain region each include a silicide region.

In other embodiments, the source regions and the drain regions of the N-type transistors 205 and 207 can each include a stress structure (not shown). The stress structures can modify the carrier mobility in the channel of the N-type transistors 205 and 207. In some embodiments, the stress structures each include a single SiC or $Si_xC_{1-x}$ layer, a multi-layer SiC or $Si_xC_{1-x}$ structure, an epitaxial structure, a compound material structure, other materials that can modify the carrier mobility of the N-type transistors 205 and 207, or any combinations thereof.

Referring to FIG. 2B, the gate electrodes 220a-220d each include an interfacial dielectric layer. The interfacial dielectric layers can be disposed over the substrate. The interfacial dielectric layers may include a material such as silicon oxide, silicon nitride, silicon oxynitride, other gate dielectric materials, or any combinations thereof.

In some embodiments, the gate electrodes 220a-220d each include a multi-layer structure that can include at least one high dielectric constant (high-k) layer and at least one metal work function layer. The at least one high-k dielectric layer can be formed over the interfacial layer. The high-k dielectric layer can include high-k dielectric materials such as $HfO_2$, HfSiO, HfSiON, HfTaO, HfSiO, HfZrO, other suitable high-k dielectric materials, or any combinations thereof. In some embodiments, the high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, or any combinations thereof.

In some embodiments, the at least one metal work function layer of the multi-layer structure can include at least one P-metal work function layer and/or at least one N-metal work function layer. In other embodiments, the at least one metal work function layer of each of the gate electrodes 220a-220d of the P-type transistors 201 and 203 can solely include at least one P-metal work function layer without any N-metal work function layer. In some embodiments, P-type work function materials can include compositions such as ruthenium, palladium, platinum, cobalt, nickel, and conductive metal oxides, and/or other suitable materials. N-type metal materials can include compositions such as hafnium, zirconium, titanium, tantalum, aluminum, metal carbides (e.g., hafnium carbide, zirconium carbide, titanium carbide, or aluminum carbide), aluminides, and/or other suitable materials.

In some embodiments, the at least one metal work function layer of the gate electrodes 220a-220d of the N-type transistors 205 and 207 can solely include at least one N-type metal work function layer without any P-type metal work function layer. In some embodiments, N-type metal materials can include compositions such as hafnium, zirconium, titanium, tantalum, aluminum, metal carbides (e.g., hafnium carbide, zirconium carbide, titanium carbide, or aluminum carbide), aluminides, and/or other suitable materials.

In some embodiments, the multi-layer structure can include at least one diffusion barrier. The at least one diffusion barrier can be disposed between the gate dielectric material and the work function metal material. The diffusion barrier can be configured to prevent metallic ions of the work function metal material from diffusing into the gate dielectric material. The diffusion barrier may comprise at least one material such as aluminum oxide, aluminum, aluminum nitride, titanium, titanium nitride (TiN), tantalum, tantalum nitride, other suitable material, and/or combinations thereof.

Referring to FIG. 2B, the gate electrodes 220a-220d each include a conductive layer. The conductive layer can be surrounded by the multi-layer structure. The conductive layer can be made of at least one material, such as aluminum, copper, Ti, TiN, TaN, Ta, TaC, TaSiN, W, WN, MoN, MoON, RuO$_2$, and/or other suitable materials.

Referring to FIG. 2B, the metallic lines 231a-231c and 231d-231f are disposed over and electrically coupled with the active areas 210a and 210b, respectively. The metallic lines 235a-235f are disposed over and electrically coupled with the metallic lines 231a-231f, respectively. In some embodiments, the metallic lines 231a-231f and 235a-235f each include at least one barrier layer (not shown) at their bottom regions. The barrier layer may comprise at least one material such as aluminum oxide, aluminum, aluminum nitride, titanium, titanium nitride (TiN), tantalum, tantalum nitride, other suitable material, and/or combinations thereof. In some embodiments, the metallic lines 231a-231f and 235a-235f each can be made of at least one conductive material, such as aluminum, copper, Ti, TiN, TaN, Ta, TaC, TaSiN, W, WN, MoN, MoON, RuO$_2$, and/or other suitable materials.

As noted, the metallic structures 237a and 237b can be optionally formed over and electrically coupled with the gate electrodes 220b and 220c, respectively. In some embodiments, the metallic structures 237a and 237b can be made of the materials that are the same as or similar to those of the metallic lines 235a-235f.

Referring to FIG. 2B, connection plugs 250a-250g are disposed over and electrically coupled with the metallic lines 235a-235d, 235f and metallic structures 237a and 237b, respectively. In some embodiments, the connection plugs 250a-250g each include at least one barrier layer (not shown) at their bottom regions. The barrier layer may comprise at least one material such as aluminum oxide, aluminum, aluminum nitride, titanium, titanium nitride (TiN), tantalum, tantalum nitride, other suitable material, and/or combinations thereof. In some embodiments, the connection plugs 250a-250g each are made of at least one conductive material, such as aluminum, copper, Ti, TiN, TaN, Ta, TaC, TaSiN, W, WN, MoN, MoON, RuO$_2$, and/or other suitable materials.

Referring again to FIG. 2B, the power rails 240a and 240b are disposed over and electrically coupled with the connection plugs 250a, 250c and 250e, respectively. The metallic lines 240c-240e are routed over and electrically coupled with the connection plugs 250f, 250b, 250d and 250g, respectively. In some embodiments, the power rails 240a-240b and the metallic lines 240c-240e each include at least one barrier layer at their bottom regions. The barrier layer may comprise at least one material such as aluminum oxide, aluminum, aluminum nitride, titanium, titanium nitride (TiN), tantalum, tantalum nitride, other suitable material, and/or combinations thereof. In some embodiments, the power rails 240a-240b and the metallic lines 240c-240e each are made of at least one conductive material, such as aluminum, copper, Ti, TiN, TaN, Ta, TaC, TaSiN, W, WN, MoN, MoON, RuO$_2$, and/or other suitable materials.

Figure 7:
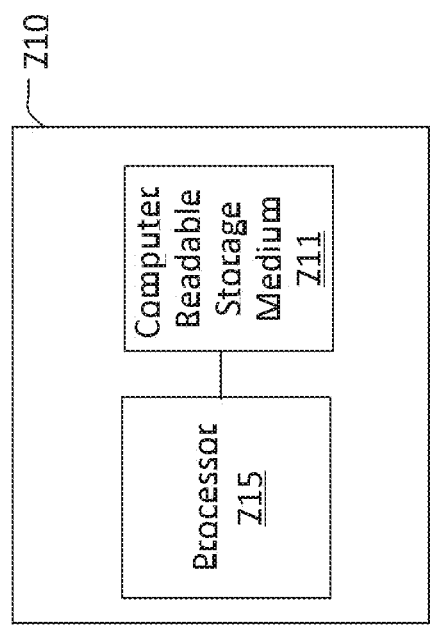
FIG. 7 is a schematic drawing illustrating an exemplary computer system for circuit designs.

FIG. 7 is a schematic drawing illustrating an exemplary computer system for circuit designs. In FIG. 7, a computer system 710 can include a computer-readable storage medium 711 that is electrically coupled with a processor 715.

In some embodiments, the computer-readable storage medium 711 is configured to store the database file corresponding to the layouts described above in conjunction with FIGS. 2B, 4A-4B, 5A-5B and 6B. In some embodiments, the computer-readable storage medium 711 can be an electronic, magnetic, optical, electromagnetic, infrared, a semiconductor system (or apparatus or device), and/or a propagation medium. For example, the computer-readable storage medium 711 can include a semiconductor or solid-state memory, a magnetic tape, a removable computer diskette, a random access memory (RAM), a read-only memory (ROM), a rigid magnetic disk, and/or an optical disk. In some embodiments using optical disks, the computer-readable storage medium 711 can include a compact disk-read only memory (CD-ROM), a compact disk-read/write (CD-R/W), and/or a digital video disc (DVD).

In some embodiments, the processor 715 can be configured to perform at least one of the processes 310-330 described above in conjunction with FIG. 3. For example, the processor 715 can perform the tape out process converting the database file of the layouts to multiple layers of photomasks. In some embodiments, the processor 715 can be encoded with a computer program code. The processor 715 can be configured to execute the computer program code for designing integrated circuits. The processor 715 can be a central processing unit (CPU), a multi-processor, a distributed processing system, and/or any suitable processing unit.

In accordance with one embodiment, an integrated circuit includes a first standard cell over a substrate, a power rail, and a first connection plug. The first standard cell includes an active area, at least one gate electrode overlapping the active area of the first standard cell, and at least one metallic line structure overlapping the active area of the first standard cell. The at least one metallic line structure is substantially parallel to the gate electrode. The power rail is substantially orthogonal to the at least one metallic line structure of the first standard cell. The power rail overlaps the at least one metallic line structure of the first standard cell, and the power rail has a flat edge extending through the first standard cell. The first connection plug is at a region where the power rail overlaps the at least one metallic line structure of the first standard cell.

In accordance with another embodiment, an integrated circuit includes a first standard cell over a substrate, a second standard cell over the substrate, and a first power rail. The first standard cell has a metallic line extending along a first direction. The second standard cell has a metallic line extending along the first direction. The first power rail extends along a second direction different from the first direction, overlaps the metallic line of the first standard cell, and overlaps the metallic line of the second standard cell. The first power rail has a flat edge extending through the first standard cell and the second standard cell.

In accordance with another embodiment, an integrated circuit includes an integrated circuit includes a first standard cell over a substrate, a second standard cell over the substrate, and a first power rail. The first standard cell has a metallic line extending along a first direction. The second standard cell has a metallic line extending along the first direction. The first power rail extends along a second direction different from the first direction, overlaps the metallic line of the first standard cell, and overlaps the metallic line of the second standard cell. The first power rail has a first flat edge extending through the first standard cell. The first power rail has a second flat edge opposite the first flat edge and extending through the second standard cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
    a first standard cell over a substrate, wherein the first standard cell comprises:
        an active area;
        at least one gate electrode overlapping the active area of the first standard cell; and
        at least one metallic line structure overlapping the active area of the first standard cell, the at least one metallic line structure being substantially parallel to the gate electrode;
    a power rail that is substantially orthogonal to the at least one metallic line structure of the first standard cell, the power rail overlapping the at least one metallic line structure of the first standard cell, wherein the power rail has a flat edge extending through the first standard cell; and
    a first connection plug at a region where the power rail overlaps the at least one metallic line structure of the first standard cell.

2. The integrated circuit of claim 1, wherein the at least one metallic line structure comprises:
    a first metallic line overlapping the active area; and
    a second metallic line overlapping the first metallic line and the power rail.

3. The integrated circuit of claim 2, wherein the first metallic line has a first length which is substantially equal to or shorter than a width of the active area.

4. The integrated circuit of claim 2, wherein the second metallic line has a second length which is substantially equal to or longer than a width of the active area.

5. The integrated circuit of claim 1, further comprising:
    a second standard cell abutted with the first standard cell, the power rail overlapping the first and second standard cells.

6. The integrated circuit of claim 5, wherein
    the second standard cell comprises at least one metallic line structure;
    the power rail overlaps the at least one metallic line structure of the second standard cell; and
    the integrated circuit further comprises a second connection plug connecting the power rail, the at least one metallic line structure of the first standard cell, and the at least one metallic line structure of the second standard cell.

7. The integrated circuit of claim 6, wherein the second connection plug has an area greater than an area of the first connection plug.

8. The integrated circuit of claim 1, wherein the power rail is over the at least one metallic line structure of the first standard cell.

9. An integrated circuit comprising:
    a first standard cell over a substrate, the first standard cell comprising a metallic line extending along a first direction;
    a second standard cell over the substrate, the second standard cell comprising a metallic line extending along the first direction; and
    a first power rail extending along a second direction different from the first direction, overlapping the metallic line of the first standard cell, and overlapping the metallic line of the second standard cell, the first power rail having a flat edge extending through the first standard cell and the second standard cell.

10. The integrated circuit of claim 9, further comprising:
    a first connection plug connecting the first power rail and the metallic line of the first standard cell; and
    a second connection plug connecting the first power rail and the metallic line of the second standard cell.

11. The integrated circuit of claim 9, wherein
    the first standard cell further comprises another metallic line extending along the first direction;
    the second standard cell further comprises another metallic line extending along the first direction; and
    the integrated circuit further comprises a second power rail extends along the second direction, overlaps the another metallic line of the first standard cell, and overlaps the another metallic line of the second standard cell, and the second power rail having a flat edge extending through the first standard cell and the second standard cell.

12. The integrated circuit of claim 9, wherein the first standard cell abuts the second standard cell.

13. The integrated circuit of claim 9, wherein
    the first standard cell further comprises an active area, and the metallic line overlaps the active area of the first standard cell.

14. The integrated circuit of claim 13, wherein the active area of the first standard cell has a width measurable along the first direction, the metallic line of the first standard cell has a length measurable along the first direction, and the length of the metallic line of the first standard cell is equal to or greater than the width of the active area of the first standard cell.

15. The integrated circuit of claim 13, wherein
the first standard cell further comprises an gate electrode extending along the first direction and overlapping the active area.

16. The integrated circuit of claim 9, wherein the first power rail is over the metallic line structure of the first standard cell and is over the metallic line structure of the second standard cell.

17. An integrated circuit comprising:
a first standard cell over a substrate, the first standard cell comprising a metallic line extending along a first direction;
a second standard cell over the substrate, the second standard cell comprising a metallic line extending along the first direction; and
a first power rail extending along a second direction different from the first direction, overlapping the metallic line of the first standard cell, and overlapping the metallic line of the second standard cell, the first power rail having a first flat edge extending through the first standard cell, and the first power rail having a second flat edge opposite the first flat edge and extending through the second standard cell.

18. The integrated circuit of claim 17, further comprising:
a connection plug connecting the first power rail, the metallic line of the first standard cell, and the metallic line of the second standard cell.

19. The integrated circuit of claim 17, wherein
the first standard cell further comprises an active area, and the metallic line overlaps the active area of the first standard cell.

20. The integrated circuit of claim 19, wherein the active area of the first standard cell has a width measurable along the first direction, the metallic line of the first standard cell has a length measurable along the first direction, and the length of the metallic line of the first standard cell is equal to or greater than the width of the active area of the first standard cell.

21. The integrated circuit of claim 19, wherein
the first standard cell further comprises an gate electrode extending along the first direction and overlapping the active area.

* * * * *